United States Patent [19]

Luryi

[11] Patent Number: 4,691,215

[45] Date of Patent: Sep. 1, 1987

[54] HOT ELECTRON UNIPOLAR TRANSISTOR WITH TWO-DIMENSIONAL DEGENERATE ELECTRON GAS BASE WITH CONTINUOUSLY GRADED COMPOSITION COMPOUND EMITTER

[75] Inventor: Sergey Luryi, Millington, N.J.

[73] Assignees: American Telephone and Telegraph Company; AT&T Bell Laboratories, both of Murray Hill, N.J.

[21] Appl. No.: 689,845

[22] Filed: Jan. 9, 1985

[51] Int. Cl.[4] .......................................... H01L 29/80
[52] U.S. Cl. ...................................... 357/22; 357/16; 357/34; 357/90
[58] Field of Search ............... 357/22, 34, 16, 22 MD, 357/22 A, 90; 372/45

[56] References Cited

U.S. PATENT DOCUMENTS 4,366,493 12/1982 Braslau et al. ........................ 357/22
4,414,557 11/1983 Amemiya et al. .................... 357/22

FOREIGN PATENT DOCUMENTS 84393 7/1983 European Pat. Off. ...... 357/22 MD
92645 11/1983 European Pat. Off. ........... 357/22 A

OTHER PUBLICATIONS

*Japanese Journal of Applied Physics*, vol. 23, No. 5, "Tunneling Hot Electron Transistor Using GaAs/AlGaAs Heterojunctions", N. Yokoyama et al., pp. L311-L312—May 1984.

*Solid State Electronics*, vol. 9, pp. 751-769, "Appraisal of Semiconductor-Metal-Semiconductor Transistor'' —1966.

Primary Examiner—Joseph E. Clawson, Jr.
Attorney, Agent, or Firm—David I. Caplan

[57] ABSTRACT

A transistor structure has a semiconductive base layer located between an emitter and a collector, the base layer during operation having an inversion layer therein which spreads out in directions transverse to the emitter-collector current path.

9 Claims, 6 Drawing Figures

HOT ELECTRON UNIPOLAR TRANSISTOR WITH TWO-DIMENSIONAL DEGENERATE ELECTRON GAS BASE WITH CONTINUOUSLY GRADED COMPOSITION COMPOUND EMITTER

FIELD OF THE INVENTION

This invention relates to a semiconductor transistor device structure having emitter, base, and collector regions, and more particularly to such a structure that is unipolar and has a base region of undoped semiconductor which has the property of being electrically conducting in directions transverse to the flow of charge carriers from the emitter to the collector during operation. This transverse conducting property is attributable to the existence of a two-dimensional degenerate Fermi gas of mobile charge carriers (electrons or holes) in the base. A more comprehensive discussion of the two-dimensional degenerate Fermi gas can be found in, for example, the paper by T. Ando et al., entitled "Electronic Properties of Two-Dimensional Systems" published in *Reviews of Modern Physics*, Vol. 54, No. 2, pp. 437-672 (1982). An example of a two-dimensional degenerate Fermi gas in a semiconductor is an inversion layer, as known in the art of conventional MOS transistors. However, whereas the direction of the electrical current in an MOS transistor (when the transistor is "on") is in the plane of the inversion layer, in this invention the direction of the current is perpendicular to the plane of the inversion layer. Furthermore, the invention involves a unipolar transistor in the sense that the same type of charge carriers—electrons or holes, but not both in a given transistor—is responsible for conduction of the controlled, relatively high electrical current through the transistor along its relatively high current-carrying path (e.g., from emitter to collector) as for conduction of the control, relatively low current (e.g., delivered from an external control source to the base of the transistor).

BACKGROUND OF THE INVENTION

In the art of semiconductor transistor structures, operating switching speeds of faster than about 20 picoseconds do not appear attainable either with conventional bipolar NPN (or PNP) transistor structures or with conventional unipolar N-MOS (or P-MOS) structures, even if their sizes be reduced still further, owing to natural limitations of such structures that seem fairly well understood by workers in the art. Accordingly, these workers have been seeking to devise new transistor structures that are not subject to such limitations, in order to achieve picosecond transistor switching operation.

For example, in a paper by N. Yokoyama et al. entitled "Tunneling Hot Electron Transistor Using GaAs /AlGaAs Heterojunctions," published in *Japanese Journal of Applied Physics*, Vol. 23, No. 5, pp. L311-L312 (1984), a transistor structure is taught which promises to achieve picosecond or even subpicosecond operation. That structure relies upon a relatively thick 1,000 Angstrom (100 nm) base layer composed of n-type semiconductive gallium arsenide—that is, gallium arsenide doped with excess significant donor impurities to render it conductive, particularly in the transverse directions to the high-current path. The base layer is located between an emitter layer and a collector layer—each also composed of n-type gallium arsenide—a base-emitter barrier layer composed of semiconductive undoped aluminum gallium arsenide intervening between the base and emitter layers, and an undoped base-collector barrier layer (also composed of aluminum gallium arsenide) intervening between the base and collector layers. Each such barrier layer produces a potential (electrical and/or chemical) barrier against transport of electrons therethrough. Operation depends upon tunneling of electrons from the emitter to the base layer in response to a positive voltage applied to the base layer with respect to the emitter layer. When this voltage is high enough, electrons will enter the base layer with a sufficient kinetic energy ("hot electrons") to pass through the base and be collected by the collector layer—provided that these electrons, after passing through the base layer where scattering and/or trapping reduce their kinetic energies, still have sufficient energy to surmount the base-collector barrier.

Such a transistor structure, however, suffers from a relatively low value of $\alpha = \beta/(1+\beta)$ where $\beta$ is the current gain of the transistor (i.e., the ratio of the increment of collector current to an increment of base current) and $\alpha$ represents the "transfer ratio"—i.e, the fraction of electrons injected (as by tunneling or other phenomena) from the emitter into the base that are collected by the collector. Specifically, the transistor had an undesirably low value of transfer ratio $\alpha$ of only about 0.28, whereas a desirable value of $\alpha$ would be at least about 0.50 and preferably much more. It is believed that this undesirably low value of $\alpha$ is caused by the relatively thick base layer in which the electrons passing therethrough, going from emitter to collector, lose a relatively high fraction (or even all) of their kinetic energy because of the scattering phenomena and/or trapping in the base and hence cannot then surmount the base-collector barrier. On the other hand, reducing the thickness of the base layer to reduce this loss of kinetic energy therein would result in an undesirably high transverse or "spreading" base resistance—which would increase the RC base delay, and hence would undesirably increase the transistor switching time to values equal to or greater than those of conventional present-day transistors. Accordingly, it would be desirable to have a transistor structure capable of picosecond operation and having a transfer ratio $\alpha$ of at least about 0.50.

SUMMARY OF THE INVENTION

This invention involves an induced base transistor structure, such as an induced base being formed by a degenerate two-dimensional gas of mobile charge carriers in a base semiconductor layer which is located between a semiconductor emitter barrier layer and a semiconductor collector barrier layer, the barrier layers thus being located on opposite parallel sides of the base layer. By semiconductor barrier "layer" is meant a semiconductor layer which forms at, or in the neighborhood of, its interface with the base layer, a prescribed potential barrier (chemical and/or electrical) against transport of charge carriers of at least one type (electrons or holes) in either direction—i.e., transport to or from the base layer from or to the barrier layer. Advantageously, the emitter barrier layer, the base layer, and the collector barrier layer together form a single crystal and are suitably designed as to their respective chemical composition profiles (and/or impurity doping profiles) so as to produce the prescribed barriers against charge transport.

The base layer of the transistor structure of the invention is advantageously rather thin, typically about 100 Angstroms, in order to reduce transport time across the base layer and thus afford picosecond switching time. In the base layer itself, the two-dimensional gas of charge carriers (electrons or holes), being degenerate (in the sense of a gas governed by Fermi statistics), acts like a metal (with high electrical conductivity) with respect to transverse transport of charge carriers, i.e., transport in the two directions perpendicular to the flow of charge carriers from the emitter barrier layer to the collector barrier layer. Accordingly, the transverse ("spreading") resistance of, and hence the RC delay time in, the base is sufficiently low in the transistor structure of this invention so that picosecond operation is not prevented by RC delay in the base. In order to achieve a similarly low base resistance with a base formed by a doped semiconductor layer, as for example in the hot-electron transistor described in the above paper by Yokoyama et al., the base layer would have to be made substantially thicker (about 1000 Angstroms or more) which, as discussed above, has an adverse effect on the transfer ratio $\alpha$. An important advantage of the invention is thus the fact that the base resistivity is rather insensitive to the base thickness, provided the latter is greater than about 50 Angstroms as explained further below.

In order to enable external electrical access to the emitter barrier layer, the base layer, and the collector barrier layer, a semiconductor emitter contact layer (which also functions as a transistor emitter of charge carrier) physically directly contacts the emitter barrier layer (but not the base layer), a semiconductor collector contact layer physically directly contacts the collector barrier layer (but not the base layer), and a base contact layer physically directly contacts the base layer (and ordinarily unavoidably a part of the emitter barrier layer or of the collector barrier layer). In particular, the base contact layer contacts the degenerate two-dimensional gas in the base layer, whereby an external circuit connected to emitter and collector contact layers and the base layer can take advantage of the resulting high transverse base conductivity and hence low RC delay in the base. The structure of the transistor of this invention is basically a s-i-s (semiconductor-intrinsic semiconductor-semiconductor), similar to the base of the metal base transistor structure (s-m-s) of prior art. For a description of a metal base transistor, see, for example, S. M. Sze and H. K. Gummel, "Appraisal of Semiconductor-Metal-Semiconductor Transistor", *Solid-State Electronics*, Vol. 9, pp. 751–769 (1966). However, the structure of this invention does not suffer from the metal base transistor's disadvantage of high reflectivity of electrons at the base-collector junctions, and hence does not suffer from the undesirably low transfer ratio $\alpha$ of the metal base transistor, as more fully explained below.

In a specific embodiment of the invention, a transistor structure comprises essentially the following successive semiconductor layers epitaxially grown in succession upon a semi-insulating gallium arsenide (GaAs) substrate: (1) an n+ doped GaAs collector contact layer, (2) an undoped semiconductive aluminum gallium arsenide ($Al_bGa_{1-b}As$, b=atomic fraction of Al) collector barrier layer, (3) an undoped semiconductor GaAs base layer, (4) an undoped semiconductor $Al_xGa_{1-x}As$ emitter barrier layer with a (typically linearly) graded atomic fraction x of Al varying from a at the interface with the base layer (where a is typically greater than or equal to b) to zero at the top of the emitter barrier layer, and (5) an n+ doped GaAs emitter contact layer. In response to a suitable dc bias voltage applied between the collector contact layer and the base layer, a two-dimensional degenerate electron gas forms in a region within the base layer contiguous with the interface of the collector barrier layer therewith; and in response to suitable signal voltages applied between the emitter contact layer and the base layer, a flow of electrical current can be controlled in an external controlled circuit portion (connected essentially across the emitter contact layer and the collector contact layer) characterized by a transfer ratio $\alpha$ that is expected to exceed 0.50. It should be understood that the flow of charge carriers through the transistor itself from emitter-to-collector is attributable to transit of these carriers through the base layer and the collector barrier layer substantially without any collisions of carriers with (fixed) atoms, as contrasted with the usual current in the base of a bipolar transistor which is attributable to diffusion of charge carriers accompanied by numerous collisions of carriers with atoms.

BRIEF DESCRIPTION OF THE DRAWING

This invention together with its features, advantages, and characteristics can be better understood from the following detailed description when read in conjunction with the drawings in which.

DETAILED DESCRIPTION

Figure 1:
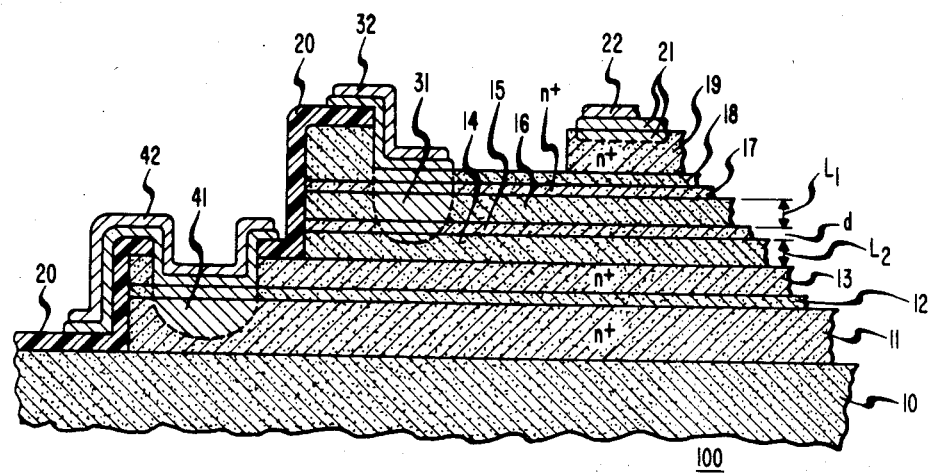
FIG. 1 is a cross-sectional diagram of a transistor device structure in accordance with a specific embodiment of the invention.

As shown in FIG. 1, a transistor device structure 100 has a semi-insulating substrate body 10 of gallium arsenide doped with chromium to provide traps in sufficient amounts to suppress electrical conduction by contaminating donor and acceptor impurities, as known in the art. Upon this substrate 10 is disposed an auxiliary collector contact layer 11 of n+ GaAs, i.e., gallium arsenide having strongly n-type semiconductor conductivity owing to the presence therein of significant excess donor impurities such as silicon in a concentration of typically about $2 \times 10^{18}$ per cubic centimeter. The thickness of the auxiliary collector contact layer 11 is typically about 5,000 Angstroms. Upon this auxiliary collector layer 11 is disposed a relatively thin (typically about 20 Angstroms) protective collector contact etch-stop layer 12 of n+ AlAs whose purpose is to delimit the penetration of the etching of the collector contact window, as more fully described below. The n+ conductivity in this protective layer 12 is obtained by doping with impurity atoms, such as silicon, to a concentration of also about $2 \times 10^{18}$ per cubic centimeter.

Upon the protective layer 12 is disposed a main collector contact layer 13 similar to the auxiliary collector contact layer 11.

Upon the main collector contact layer 13 is disposed an undoped collector barrier layer 14 of undoped $Al_aGa_{1-a}As$, typically 1,500 Angstroms thick, with the atomic fraction a of aluminum in the approximate range of 0.25 to 0.45, typically about 0.34. It is desirable that the concentration of any donor and acceptor impurities be less than about $10^{16}$ per cubic centimeter in order not to degrade the potential barrier with a base layer 15 disposed thereupon.

The base layer 15 is undoped GaAs having a thickness of about 100 Angstroms and a concentration of donors and acceptors of typically less than about $10^{16}$ per cubic centimeter, preferably less than about $10^{15}$ per cubic centimeter to ensure high electron mobility of an inversion layer therein—i.e., a two-dimensional degenerate Fermi electron gas, the electrons behaving as free electrons in the two spatial directions perpendicular to the horizontal direction in the drawing. The thickness of the base layer, in any event, is preferably less than about 500 Angstroms, to minimize undesirable electron scattering effects therein, and is greater than about 50 Angstroms, to supply sufficient space to accommodate a wave function of sufficient extent for a suitable number of quantum levels to form therein.

Upon the base layer 15 is disposed an emitter barrier layer 16 of undoped $Al_xGa_{1-x}As$, typically about 1,500 Angstroms thick, with the atomic fraction x of aluminum varying (typically linearly) therein with vertical distances from typically about zero at the top to about 0.45 at the bottom thereof (i.e., the interface with the base layer 15). Again, the concentrations of donor and acceptor impurities are both less than about $10^{16}$ per cubic centimeter in order to prevent degradation of the potential barrier at the interface with the base layer 15.

Upon the emitter barrier layer 16 is disposed a main emitter contact layer 17, which may also be called a "cap" layer, of n+ GaAs having a thickness of typically about 200 Angstroms and an excess donor concentration of at least about $2 \times 10^{18}$ per cubic centimeter.

Upon the auxiliary emitter contact layer 17 is disposed a protective emitter contact etch-stop layer 18 of n+ AlAs, similar in structure to the protective collector contact etch-stop layer 12. Both of these etch-stop layers are known as "spike" layers because of the spike-like shapes of the chemical compositional profile that they create.

Upon the protective emitter contact etch-stop layer 18 is disposed an auxiliary emitter contact layer 19 of n+ GaAs (in the form of a mesa) having a thickness (height) of typically about 2,500 Angstroms.

External electrical access to the emitter contact layer 19 is made via a first gold-germanium-silver alloy layer 21 overlaid with a gold emitter terminal layer 22. External access to the base layer 15 is made via a second gold-germanium-silver alloy layer 31 overlaid with a gold base terminal layer 32. External access to the collector contact layer 11 is made via a third gold-germanium-silver alloy layer 41 overlaid with a gold collector terminal layer 42.

Figure 2:
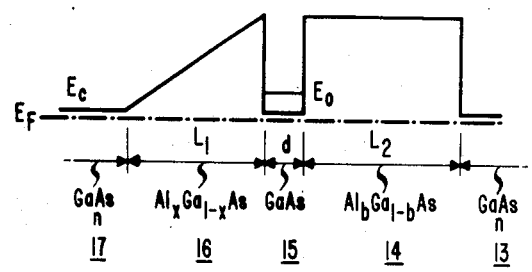
FIGS. 2 and 3 are energy diagrams useful for explaining the operation of the transistor device shown in FIG. 1.
Figure 3:
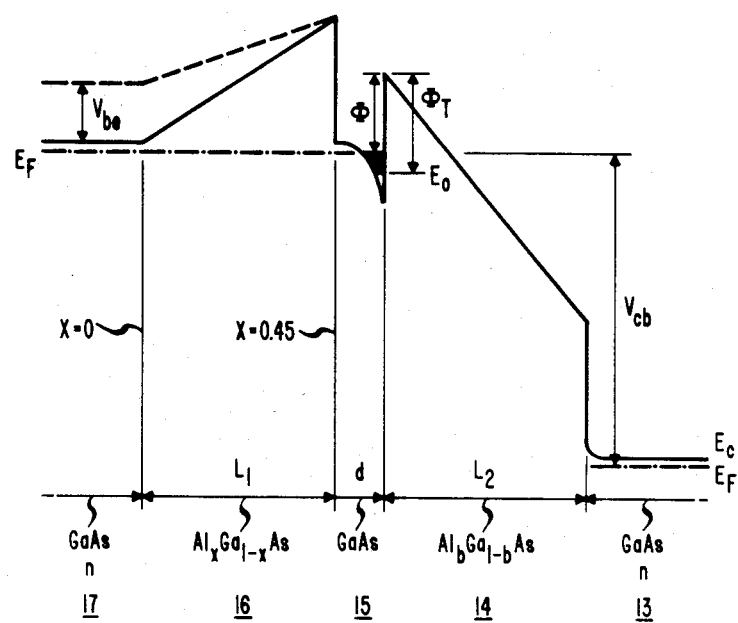

In order to understand the operation of the device 100, it is helpful to refer to FIGS. 2 and 3. Here the zero level $E_c$ of electron kinetic energy (the conduction-band profile) under zero base-emitter bias voltage is designated by the solid line, and is designated in FIG. 3 by the dashed line in the case of an applied forward base-emitter voltage $V_{be}$. The Fermi level $E_F$ is designated by the dot-dashed line in FIGS. 2 and 3. FIG. 2 depicts the conduction-band diagram with zero bias voltage; FIG. 3 depicts it with a base-collector and a base-emitter bias voltage. For illustrative purposes, in FIGS. 2 and 3 the doping in n-type contact layers 13 and 17 is nondegenerate, i.e., of order $10^{17}$ donor per cubic centimeter, so that the Fermi level $E_F$ falls below $E_c$ instead of above $E_c$ as would occur in the above-described 3 embodiment with (degenerate) doping of about $2 \times 10^{18}$ donor per cubic centimeter. An applied collector-base voltage $V_{cb}$ (FIG. 3) renders the collector positively biased with respect to the base. As a result, a degenerate Fermi gas of electrons is induced in the base layer 15 ranging in energy between a lowest quantum level $E_o$ and the Fermi level $E_F$. Accordingly, the base layer of thickness d acts as a metal base in transverse directions.

It should be understood that in other embodiments of the invention, the degenerate Fermi gas can be present even in the absence of an applied collector voltage.

During operation, electrons thermionically emitted from the emitter (where electrons are the majority carriers) enter into the base (where they are "hot", i.e., have higher than thermal kinetic energy), pass through the base, and enter into the collector barrier layer of thickness $L_2$—provided these electrons are not reflected by the barrier at the collector-base interface, of height designated in FIG. 3 by $\Phi_T$. The barrier height for thermionic emission from the emitter into the base is controlled by the emitter-base voltage, $V_{be}$, as is illustrated by the dashed line in FIG. 3. The more the emitter is made negative with respect to the base (i.e., the larger the value of $V_{be}$), the more the number of thermal electrons that have enough energy to surmount the emitter barrier, enter into the base, and then reach the collector, hence the more the external current, as desired in transistor action.

The probability of above-barrier reflection (a quantum mechanical effect) by the barrier $\Phi_T$ of an electron of kinetic energy $E > \Phi_T$ (the lowest kinetic energy quantum level being $E_o$) in the base toward the collector is given by:

$$R = (n-1)^2/(n+1)^2 \qquad (1)$$

where $$n = (1 - \Phi_T/E)^{\frac{1}{2}} \qquad (2)$$

Thus, since typically $\Phi_T = 0.2$ electron volts and $E = 0.4$ electron volts for a hot electron, it follows that typically $n = 0.7$ and $R = 0.03 = 3\%$. Thus, only about 3% of the hot electrons that enter into the base from the emitter are reflected by the collector barrier layer. This relatively low value of 3% reflection probability R should be contrasted with the undesirably relatively high reflection probability R in the case of a metal base transistor, which typically is over 50%, owing largely to the fact that in the case of a metal base the level $E_o$ of lowest energy is much lower, and hence $\Phi_T$ and R are much higher, than in the case of a degenerate Fermi gas in a semiconductor.

The Fermi gas of (degenerate) electrons in the base in the semiconductor produce a sheet resistance of about 400 • per square or less, which is independent of base thickness d provided d is larger than the characteristic extent of the wave function for electrons in the base. The phonon-limited mobility of electrons in the plane of the base layer is about 8,500 centimeters per volt-second at room temperature. This mobility is thus enhanced as a result of the formation of the degenerate electron gas in the relatively pure (undoped) semiconductor of the base layer. The mobility is even greater (typically over 100,000 centimeters per volt-second) at sufficiently lower temperatures, such as 77 degrees K of liquid nitrogen. An ambient low temperature of this magnitude may be desirable to reduce the thermal noise in the transistor structure. However, as far as the RC delay arising from the base spreading resistance (the base charging time) is concerned, estimates show that even at room temperature the induced base sheet resistance is low enough so as not to interfere with the desired picosecond speed of operation.

The thickness $L_2$ of the collector barrier ideally is made as small as possible but not so small as to allow the collector contact layer to be short-circuited to the base, as by a short-circuit between their respective contacts for external electrical access. On the other hand, the thickness $L_1$ of the emitter barrier layer is advantageously sufficient to result in a desirable threshold voltage (i.e., the applied base-emitter and base-collector voltages at which the transistor structure turns on). In any event, however, this thickness $L_1$ should be at least about 500 Angstroms in order to reduce undesirable depletion of the base caused by the emitter to base voltage.

It is important that the semiconductor in the base should have its conduction-band minimum located near the same electronic quasi-momentum (same point in the Brillouin zone) as does the semiconductor in the collector barrier layer. Otherwise, the transport of electrons from base to collector would be blocked in electronic momentum space. Therefore, the GaAs—$Al_bGa_{1-b}As$ base-collector combination advantageously should be restricted by the condition that the atomic fraction b be less than about 0.45.

Figure 4:
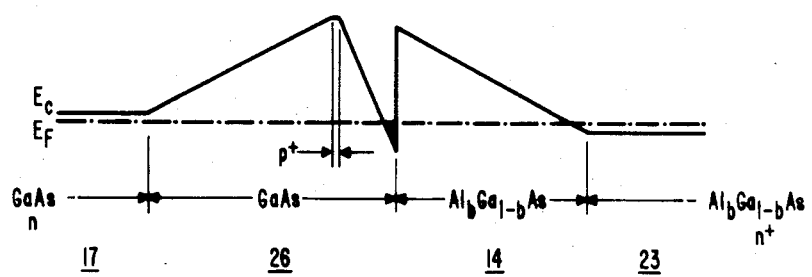
FIG. 4 is a cross-sectional diagram of a transistor device structure in accordance with another specific embodiment of the invention.

FIG. 4 illustrates an alternative embodiment in which the $Al_xGa_{1-x}As$ emitter barrier layer 16 (FIG. 2), with x varying with distance, together with the GaAs base layer 15 are replaced by a single GaAs layer 26 having a permanent fixed negative charge sheet produced by an acceptor impurity doped (p+) layer to form what is known as a planar-doped barrier whereby the left-hand side of the potential well is formed by a severe band-bending comprising a severe bending of the zero kinetic energy level $E_c$. Advantageously, the thickness and doping level in this p+ charge sheet is selected to be such as to produce during operation the same (or similar) desired potential well in the neighborhood of the $Al_bGa_{1-b}As$ layer 14 as in the case of the structure shown in FIG. 3. It is important that the concentration of acceptors in the charge sheet is not so high (degenerate) as to produce a conducting region thereat. Typically, the acceptor concentration is about $2 \times 10^{18}$ acceptors per cubic centimeter, the thickness of this sheet is about 50 Angstroms, and the sheet is spaced from the right-hand edge of the layer 26 by a distance of about 200 Angstroms.

In a further (independent) alternative embodiment, the GaAs collector layer 13 (FIG. 2) can be replaced with, for example, a very highly (degenerately) doped n+ $Al_bGa_{1-b}As$ layer 23, with b equal to typically about 0.3 in both this layer 23 and the collector barrier layer 14, and with an impurity doping concentration in layer 23 of typically about $2 \times 10^{18}$ donor atoms per cubic centimeter. However, this doping need not be degenerate but may be of the order of $10^{17}$ donor per cubic centimeter. This collector layer 23, because of its bandgap and n-type doping, produces a built-in electric field in the collector barrier layer 14 which induces a two-dimensional degenerate electron gas in the base even in the absence of an applied collector-base bias voltage.

Moreover, to ensure a negative threshold voltage—i.e., to ensure formation of an inversion layer in the base when the applied collector-base voltage is zero—the collector barrier layer 14 (FIG. 2) can be modulation doped with donor impurities, as known in the art, in such a manner as to result in a profile of the impurities that bend the energy bands, and hence bend the zero kinetic energy level $E_c$, in particular, in a concave upward direction. For example, part of the collector barrier layer 14 of $Al_bGa_{1-b}As$ can be doped with silicon in a uniform concentration of about $10^{18}$ atoms per cubic centimeter. In doing so, the region in the collector barrier layer extending for about 80 Angstroms thereinto from the interface thereof the base layer 15 should remain undoped. In this way, the donors, fixed in the collector barrier layer, are spatially separated from the mobile electrons in the base layer, whereby undesirable scattering, otherwise caused by the fixed donors, of mobile electrons in the base layer (which would diminish their mobility and thus undesirably increase the base sheet resistance) is avoided. At the same time, the concave profile of the energy bands in the collector barrier layer induces an inversion layer in the base layer under the condition of zero collector-base bias.

Figure 5:
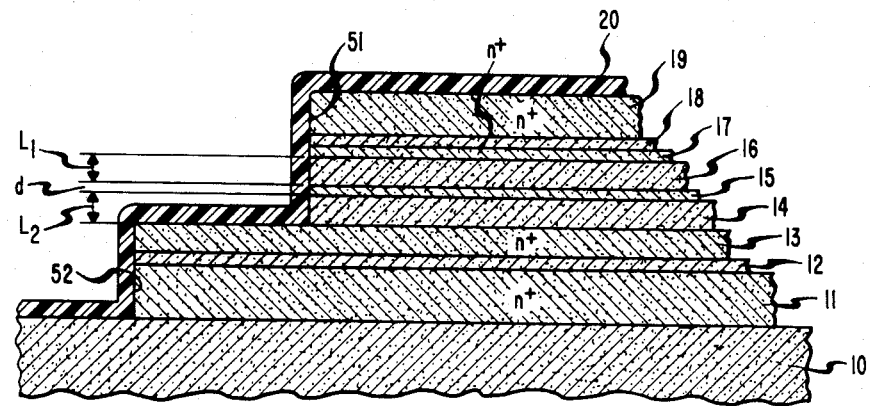
FIGS. 5–6 are cross-sectional diagrams of the transistor device structure shown in FIG. 1 during earlier stages of its manufacture.
Figure 6:
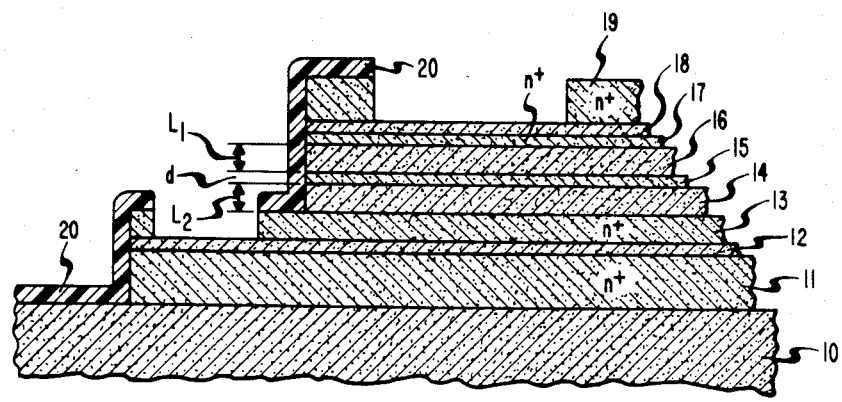

To fabricate the transistor structure 100, the semiconductor layers 11 through 19 are successively grown epitaxially by molecular beam or other standard epitaxial processes—such as metal organic chemical vapor deposition—upon a major surface of the substrate 10. Etching—as by means of suitable etching solutions and selective masking, as known in the art of mesa formation-followed by coating with a silicon nitride layer 20, typically 2,000 Angstroms thick, brings the transistor being fabricated to the structure shown in FIG. 5, basically a double mesa structure with two spaced apart mesa sidewalls 51 and 52. Next, windows are opened in the contact layers 13 and 19, as by wet etching, using the layers 12 and 18, respectively, as etch stops. The lateral size of these windows can be as small as about several microns or less, depending upon the feature size obtainable. The portion of the silicon nitride layer 20 overlying the contact layer 19 in an immediate neighborhood of the right-hand edge of the window therein is also removed to a sufficient lateral extent for alloy contacting, again depending upon the feature size. Next, alloy layers 21, 31, and 41 of gold-germanium-silver are formed by standard procedures, to provide contacts for the emitter, base, and collector, respectively. Finally, contact layers 22, 32, and 42 are formed by standard procedures, to provide electrical access to the emitter, base, and collector contact layers, respectively. The remaining exposed top surface of the etch-stop layer 18 can then be coated with a suitable protective layer (not shown) of silicon nitride. As known in the art, external electrical circuitry (not shown) can then be attached to the emitter, base, and collector terminal layers to complete an electrical circuit in which the transistor structure 100 operates as a switching device.

Although the invention has been described in detail in terms of a specific embodiment, various modifications can be made without departing from the scope of the invention. For example, instead of n-type semiconductor, p-type can be used, so that the degenerate Fermi gas is of mobile holes. It should be recognized by those skilled in the art, of course, that the potential barriers for holes are different from (ordinarily—in the case of Group III-V compound semiconductor heterojunction, such as GaAs/AlGaAs—less than) those for electrons. Other semiconductors can be used, such as various compound semiconductors formed by ternary and quaternary combinations of Group III with Group V elements, namely (Ga, Al, In) with (As, P, Sb), as well as combinations of Group II with Group VI elements, such as (Zn, Cd, Hg) with (S, Se, Te). Group IV elements are not ideally suited for implementation of the invention with electron-type (n-type) conduction. A major obstacle for making an n-type transistor with such Group IV heterojunction combinations as silicon and germanium lies in the fact that these materials have their conduction-band minima at different points of the Brillouin zone, thus making momentum-space reflection of electrons in germanium at the silicon interface a severe problem. However, it is feasible to implement with these materials a structure similar but complementary to that illustrated in FIG. 4—that is, a p-type transistor with the base formed by a hole gas induced in an undoped germanium layer near the interface with a silicon layer. Silicon is a wider bandgap material than germanium, and the valence band discontinuity is known to be sufficient to confine a two-dimensional hole gas at the interface (at least at sufficiently low—e.g., liquid nitrogen—temperatures).

Also, it is feasible to use silicon or germanium substrates for subsequent growth of heteroepitaxial Group III-V compound semiconductor layers with the required energy-band profile—that is, replacing in FIG. 1 the semi-insulating GaAs substrate 10 by a Si or Ge substrate, or a Ge-coated silicon substrate. Such material combinations may be desirable for economic reasons attributable to a substantially lower cost of Si substrates.

What is claimed is:

1. A unipolar transistor comprising:
   (a) a semiconductor base layer having first and second opposing surfaces;
   (b) a semiconductor emitter barrier layer contiguous with the first surface of the layer;
   (c) a semiconductor collector barrier layer contiguous with the second surface of the base layer;
   (d) a separate electrical contact to each of the emitter barrier layer, the base layer, and the collector barrier layer,
   means for forming a degenerate two-dimensional gas of mobile charge carriers in said base layer,
   the semiconductor emitter barrier layer being composed of a compound containing an element having a concentration that is continuously graded in a first direction perpendicular to the first surface of the base layer so that the bandgap of the emitter barrier layer is graded in that the bandgap increases in the first direction going toward the first surface of the base layer, whereby during operation, when a forward bias voltage is applied to the emitter barrier layer contact and a negative bias is applied to the collector barrier layer contact, said degenerate two-dimensional gas of mobile charge carriers exists in the base layer extending to the electrical contact thereto, and a flow of electrical current perpendicular to the first surface of the base layer between the emitter barrier layer contact and the collector barrier layer contact through the base layer is controllable by voltages applied to the electrical contacts.

2. The transistor of claim 1 in which base layer is undoped and the emitter barrier layer is essentially undoped $Al_xGa_{1-x}As$ with x increasing in the first direction going toward the first surface.

3. An electrical circuit including a transistor in accordance with claim 2.

4. An electrical circuit including a transistor in accordance with claim 1.

5. A transistor structure comprising in succession:
   (a) a semiconductor collector contact layer;
   (b) an undoped semiconductor collector barrier layer;
   (c) a semiconductor base layer;
   (d) an undoped semiconductor emitter barrier layer composed of a compound containing a concentration of at least one element of the compound that is continuously graded in a first direction perpendicular to an interface between the emitter barrier layer and the base layer such that the bandgap in the emitter barrier layer increases in the first direction going toward the interface; means for forming a degenerate two-dimensional gas of mobile charge carriers in said base layer
   (e) a semiconductor emitter contact layer, in which during operation, when a forward bias voltage is applied to emitter contact layer relative to a base contact layer contacting the base layer and a negative bias voltage is applied to the collector contact layer relative to the base contact layer, said degenerate two-dimensional gas of mobile charge carriers exists in the base layer and a flow of charge carriers from the emitter contact layer to the collector contact layer perpendicular to the degenerate two-dimensional gas plane can be controlled by voltages applied between the base contact layer and the emitter contact layer.

6. The structure of claim 5 in which the emitter barrier layer is essentially $Al_xGa_{1-x}As$ in which x increases in the first direction going toward the interface.

7. An electrical circuit including the structure of claim 6.

8. An electrical circuit including the structure of claim 5.

9. A transistor structure having a semiconductive base layer located between an emitter and a collector, means for forming a degenerate two-dimensional gas of mobile charger carriers in the base layer which spreads out in a direction transverse to the emitter-collector current path, the emitter including an emitter barrier layer contacting the base layer at an interface, the emitter barrier layer being composed of a compound semiconductor containing a concentration of at least one element of the compound that is continuously graded in a first direction perpendicular to the interface so that the bandgap in the emitter barrier layer increases in the first direction going toward the interface.

* * * * *